(12) United States Patent
Kanai

(10) Patent No.: US 7,638,244 B2
(45) Date of Patent: Dec. 29, 2009

(54) METHOD OF CORRECTING MASK DATA, METHOD OF MANUFACTURING A MASK AND METHOD OF MANUFACTURING A SEMICONDUCTOR DEVICE

(75) Inventor: Hideki Kanai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 769 days.

(21) Appl. No.: 11/058,175

(22) Filed: Feb. 16, 2005

(65) Prior Publication Data

US 2006/0083995 A1    Apr. 20, 2006

(30) Foreign Application Priority Data

Feb. 16, 2004   (JP)   ............... 2004-038034

(51) Int. Cl.
*G06F 17/50* (2006.01)
(52) U.S. Cl. ............... 430/5; 716/19; 716/21
(58) Field of Classification Search ............ 716/21, 716/19; 430/5
See application file for complete search history.

(56) References Cited

U.S. PATENT DOCUMENTS

| 6,516,459 B1 * | 2/2003 | Sahouria ............... 716/21 |
| 2002/0066069 A1 * | 5/2002 | Ashida et al. ........... 716/19 |

FOREIGN PATENT DOCUMENTS

| JP | 3-089347 | 4/1991 |
| JP | 7-106227 | 4/1995 |
| JP | 2000-047366 | 2/2000 |
| JP | 2000-258892 | 9/2000 |
| JP | 2001-42545 | 2/2001 |
| JP | 2001-100390 | 4/2001 |
| JP | 2002-359352 | 12/2002 |

(Continued)

OTHER PUBLICATIONS

Notice of Reasons for Rejection from the Japanese Patent Office, mailed Apr. 21, 2009, in Japanese Patent Application No. 2004-038034, and English translation thereof.

(Continued)

*Primary Examiner*—Stephen Rosasco
*Assistant Examiner*—Rashid Alam
(74) *Attorney, Agent, or Firm*—Finnegan, Henderson, Farabow, Garrett & Dunner, L.L.P.

(57) ABSTRACT

A method of correcting mask data performs a proximity effect correction process to a pattern shape of a photomask to form a photosensitive material film provided on a substrate to be processed or a film to be processed by using the photosensitive material film as a mask into a pattern of a desired-shape. Model-based proximity effect correction is performed to the pattern shape of the photomask to correct the pattern shape of the photomask, an estimated shape of the pattern in the photosensitive material film or the film to be processed is calculated on the basis of the pattern shape of the photomask subjected to the model-based proximity effect correction, an error between the calculated estimated shape and the desired shape is calculated, and rule-based proximity effect correction is performed to a predetermined interested portion on the basis of the calculated error to further correct the pattern shape of the photomask.

20 Claims, 10 Drawing Sheets

FOREIGN PATENT DOCUMENTS

| | | |
|---|---|---|
| JP | 2003-167323 | 6/2003 |
| JP | 2003-525470 | 8/2003 |
| JP | 2004-363390 | 12/2004 |
| WO | WO 01/65315 A2 | 9/2001 |
| WO | WO 0165315 A2 * | 9/2001 |

OTHER PUBLICATIONS

Final Notice of Rejection mailed Jul. 14, 2009, in corresponding Japanese patent application No. 2004-038034, and English-language translation of same.

* cited by examiner

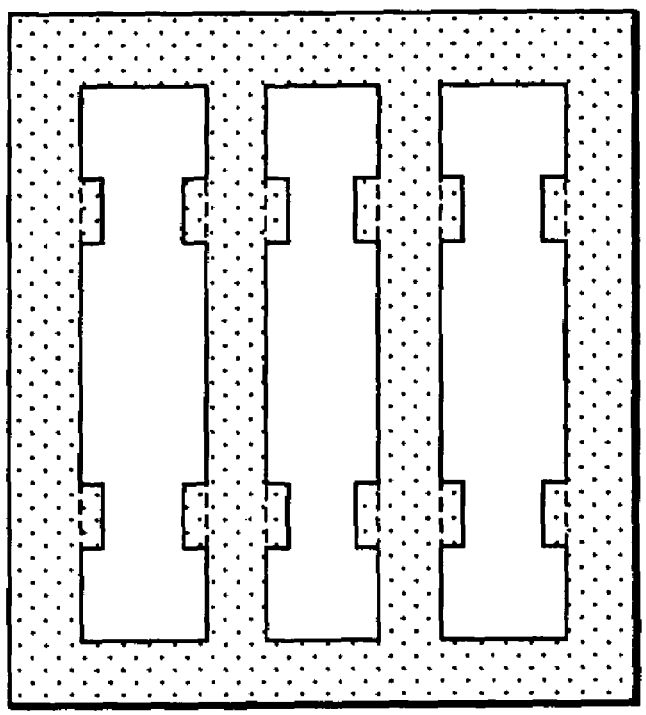
F I G. 33
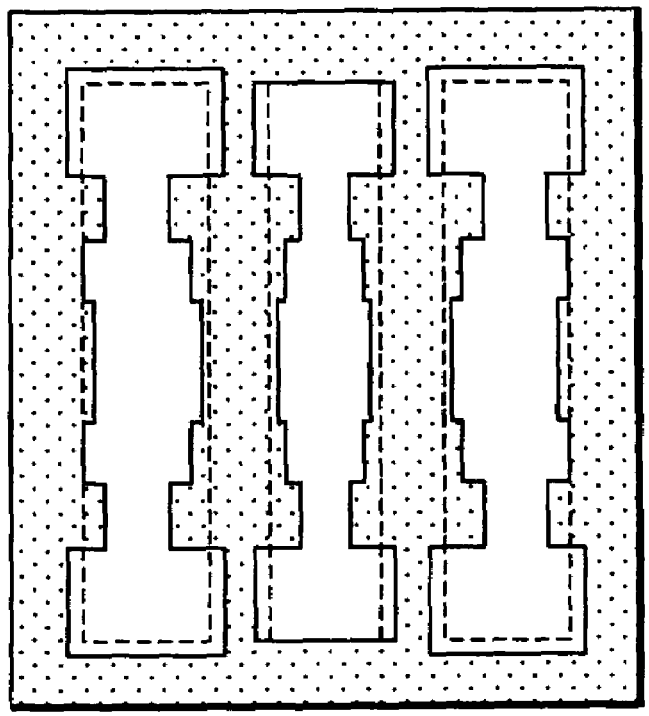
F I G. 34

METHOD OF CORRECTING MASK DATA, METHOD OF MANUFACTURING A MASK AND METHOD OF MANUFACTURING A SEMICONDUCTOR DEVICE

CROSS-REFERENCE TO RELATED APPLICATIONS

This application is based upon and claims the benefit of priority from the prior Japanese Patent Application No. 2004-38034, filed Feb. 16, 2004, the entire contents of which are incorporated herein by reference.

BACKGROUND OF THE INVENTION

1. Field of the Invention

The present invention relates to a method of correcting mask data to correct influence of proximity effect, a method of manufacturing a mask, and a method of manufacturing a semiconductor device.

2. Description of the Related Art

In recent years, in manufacturing of a semiconductor memory device, an integration density of devices and wires constituting a circuit is increased, and miniaturization of a pattern is advanced. In manufacturing of an RISC (Reduced Instruction Set Computer) processor or the like used as a CPU (Central Processing Unit) for an EWS (Engineering Work Station) or a PC (Personal Computer), in 2002, a gate pattern width of 100 nm or less is required to be realized as a gate pattern width of a transistor.

With miniaturization and complication of a circuit pattern, in a photolithography step in which a pattern on a photomask is transferred onto a semiconductor wafer, a low pattern formation accuracy becomes serious, and improvement of formation accuracy of a micropattern is pursued. As a conventional measure for improving the formation accuracy, a resolution enhancement exposure method called a phase shift mask exposure method which improves the contrast to an image projected on the semiconductor wafer by changing the phase of light transmitting a photomask is proposed. A resolution enhancement exposure method called an oblique incident illumination method is also proposed.

In design of a gate pattern of a semiconductor device such as random logic, in order to reduce manufacturing costs, not only a line width of a gate portion but also a line width of a connected wiring portion which connects a gate and a contact pad to each other is required to be a small width of 150 nm or less. A spacing of patterns is required to be a spacing of patterns which is extremely small, i.e., 200 nm or less.

As a method of forming such a pattern, the following double exposure method (for example, Jpn. Pat. Appln. KOKAI Publication No. 7-106227) is known. That is, an alternating phase shifting mask (alternating phase shifting mask) and a binary mask are sequentially exposed to form a resist pattern, and a slimming process of an underlying film is performed using the resist pattern as a mask. The slimming process is a process called trimming or resist trimming. A double transfer method which forms a first resist pattern, performs a slimming process of an underlying film by using the first resist pattern as a mask, and forms a resist pattern again (for example, Jpn. Pat. Appln. KOKAI Publication No. 2002-359352).

In a photolithography technique, with a decrease in design rule of a film pattern formed on a wafer, it becomes difficult to transfer a design pattern on the wafer in a desired shape and a desired size. A process of correcting a mask shape such that the design pattern is transferred on the wafer in a desired shape and a desired size is called an OPC (Optical Proximity effect Correction) process. This process is essential in a recent lithography technique. Furthermore, a process called an OPC (also referred to as PPC (Process Proximity Correction) process when a process bias is included) process which corrects the mask shape including the process bias generated for various reasons is also used.

In the OPC process, in general, an external edge is divided by using corners of a layout pattern, and correction is performed in units of divided edges (to be referred to as segments hereinafter). An evaluation point called a control point and which typifies an edge is arranged for each segment, and a transfer edge position on the wafer at the position corresponding to the evaluation point is calculated to correct the shape of the mask. This is called model-based OPC.

In general, a short segment very slightly affects an image transferred to the wafer. However, at a position where a change of light intensity is large, a very large correction result is obtained as a local correction result, and the short segment may contrarily deteriorate correction accuracy or may adversely affect mask writing or inspection. For this reason, the short segment must be removed from mask writing data. In addition, with an increase in number of control points, correction process time becomes long, and writing data disadvantageously increases. For this reason, at the present, the length of each segment is limited to a certain length.

For example, a first segment from a corner of a pattern opening is set to be long, and second and subsequent segments are generally set to be shorter than the first segment from the corner of the pattern opening to avoid the following drawback. That is, when the first segment from the corner of the pattern opening is set to be short, the above problem in which a correction value is locally very large is posed. Furthermore, the second and subsequent segments are also carefully set to avoid the above problem.

A correction method called rule-based OPC is known. In this correction method, a mask shape in which a transfer edge position is approximate to a displacement of a target, is calculated by an experiment or a simulation in advance, a rule is determined to correct a design pattern so that the mask shape is created, and the mask shape is corrected by using the rule. For example, when a certain line pattern is corrected, a correction amount depending on the size of a space adjacent to the line pattern is selected by using the rule formed in advance to perform correction.

When the alternating phase shifting mask is used, in a transferred pattern, necking may disadvantageously occur at a position separated from the corner of the pattern opening by a distance smaller than the wavelength of exposure light (for example, Jpn. Pat. Appln. KOKAI Publication No. 2001-42545). In particular, in a gate pattern formed by using the alternating phase shifting mask, a gate size is narrow (i.e., a gate length is short), and a current leak called gate leak occurs to increase a power consumption, thereby causing a critical defect. Therefore, it is very important to correct the necking at high accuracy.

However, in a current OPC technique, it is extremely difficult to correct one local point of the pattern shape, and the necking cannot be completely corrected.

In this manner, in the photolithography technique in manufacturing of a semiconductor integrated circuit, the OPC process is essential. In the alternating phase shifting mask, the necking may occur at a position separated from the corner of the pattern opening by a distance slightly smaller than the exposure wavelength in the transferred pattern, and the necking cannot be corrected at high accuracy disadvantageously.

BRIEF SUMMARY OF THE INVENTION

According to a first aspect of the present invention, there is provided a method of correcting mask data which performs a proximity effect correction process to a pattern shape of a photomask to form a photosensitive material film provided on a substrate to be processed or a film to be processed by using the photosensitive material film as a mask into a pattern of a desired-shape, the method comprising: performing model-based proximity effect correction to the pattern shape of the photomask to correct the pattern shape of the photomask; calculating an estimated shape of the pattern in the photosensitive material film or the film to be processed on the basis of the pattern shape of the photomask subjected to the model-based proximity effect correction; calculating an error between the calculated estimated shape and the desired shape; and performing rule-based proximity effect correction to a predetermined interested portion on the basis of the calculated error to further correct the pattern shape of the photomask.

According to a second aspect of the present invention, there is provided a method of manufacturing a mask, comprising converting mask pattern data corrected by the method of correcting mask data according to the first aspect into writing data and manufacturing a photomask having a mask pattern of the corrected shape by using the converted writing data.

According to a third aspect of the present invention, there is provided a method of manufacturing a semiconductor device, comprising exposing and transferring a pattern of a desired shape to a film to be processed on a semiconductor wafer by using a photomask manufactured by the method of manufacturing a mask according to the second aspect and processing the film to be processed to form a film pattern to be processed of the transferred pattern shape on the semiconductor wafer.

According to a fourth aspect of the present invention, there is provided a method of correcting mask data which performs a proximity effect correction process to a pattern shape of a photomask to form a photosensitive material film provided on a substrate to be processed or a film to be processed by using the photosensitive material film as a mask into a pattern of a desired-shape, the method comprising: performing rule-based proximity effect correction to a predetermined interested portion to correct the pattern shape of the photomask; and performing model-based proximity effect correction to further correct the pattern shape of the photomask.

According to a fifth aspect of the present invention, there is provided a method of manufacturing a mask, comprising converting mask pattern data corrected by the method of correcting mask data according to the fourth aspect into writing data and manufacturing a photomask having a mask pattern of the corrected shape by using the converted writing data.

According to a sixth aspect of the present invention, there is provided a method of manufacturing a semiconductor device, comprising exposing and transferring a pattern of a desired shape to a film to be processed on a semiconductor wafer by using a photomask manufactured by the method of manufacturing a mask according to the fifth aspect and processing the film to be processed to form a film pattern to be processed of the transferred pattern shape on the semiconductor wafer.

According to a seventh aspect of the present invention, there is provided a method of correcting mask data which performs a proximity effect correction process to a pattern shape of a photomask to form a photosensitive material film provided on a substrate to be processed or a film to be processed by using the photosensitive material film as a mask into a pattern of a desired-shape, the method comprising: performing model-based proximity effect correction to the pattern shape of the photomask to correct the pattern shape of the photomask; calculating an estimated shape of a pattern on the photosensitive material film or the film to be processed on the basis of the pattern shape of the photomask to which the model-based proximity effect correction is performed; calculating an error between the calculated estimated shape and the desired shape; setting a plurality of correction amounts to a predetermined interested portion to estimate a pattern shape of on the photosensitive material film or the film to be processed; and selecting an optimum pattern shape of the photomask such that an error between the calculated estimated shape and the desired shape is minimum.

According to an eighth aspect of the present invention, there is provided a method of manufacturing a mask, comprising converting mask pattern data corrected by the method of correcting mask data according to the seventh aspect into writing data and manufacturing a photomask having a mask pattern of the corrected shape by using the converted writing data.

According to a ninth aspect of the present invention, there is provided a method of manufacturing a semiconductor device, comprising exposing and transferring a pattern of a desired shape to a film to be processed on a semiconductor wafer by using a photomask manufactured by the method of manufacturing a mask according to the eighth aspect and processing the film to be processed to form a film pattern to be processed of the transferred pattern shape on the semiconductor wafer.

According to a tenth aspect of the present invention, there is provided a method of correcting mask data which performs a proximity effect correction process to a pattern shape of a photomask to form a photosensitive material film provided on a substrate to be processed or a film to be processed by using the photosensitive material film as a mask into a pattern of a desired-shape, the method comprising: performing model-based proximity effect correction to the pattern shape of the photomask to correct the pattern shape of the photomask; and performing model-based proximity effect correction to the pattern shape of the photomask while changing a correction algorithm to further correct the pattern shape of the photomask.

According to an eleventh aspect of the present invention, there is provided a method of manufacturing a mask, comprising converting mask pattern data corrected by the method of correcting mask data according to the tenth aspect into writing data and manufacturing a photomask having a mask pattern of the corrected shape by using the converted writing data.

According to a twelfth aspect of the present invention, there is provided a method of manufacturing a semiconductor device, comprising exposing and transferring a pattern of a desired shape to a film to be processed on a semiconductor wafer by using a photomask manufactured by the method of manufacturing a mask according to the eleventh aspect and processing the film to be processed to form a film pattern to be processed of the transferred pattern shape on the semiconductor wafer.

BRIEF DESCRIPTION OF THE SEVERAL VIEWS OF THE DRAWING

FIG. 33 is a plan view showing a mask shape corrected by OPC;

FIG. 34 is a plan view showing a mask shape corrected by OPC;

DETAILED DESCRIPTION OF THE INVENTION

Embodiments of the present invention will be described below with reference to the accompanying drawings.

First Embodiment

Figure 1:
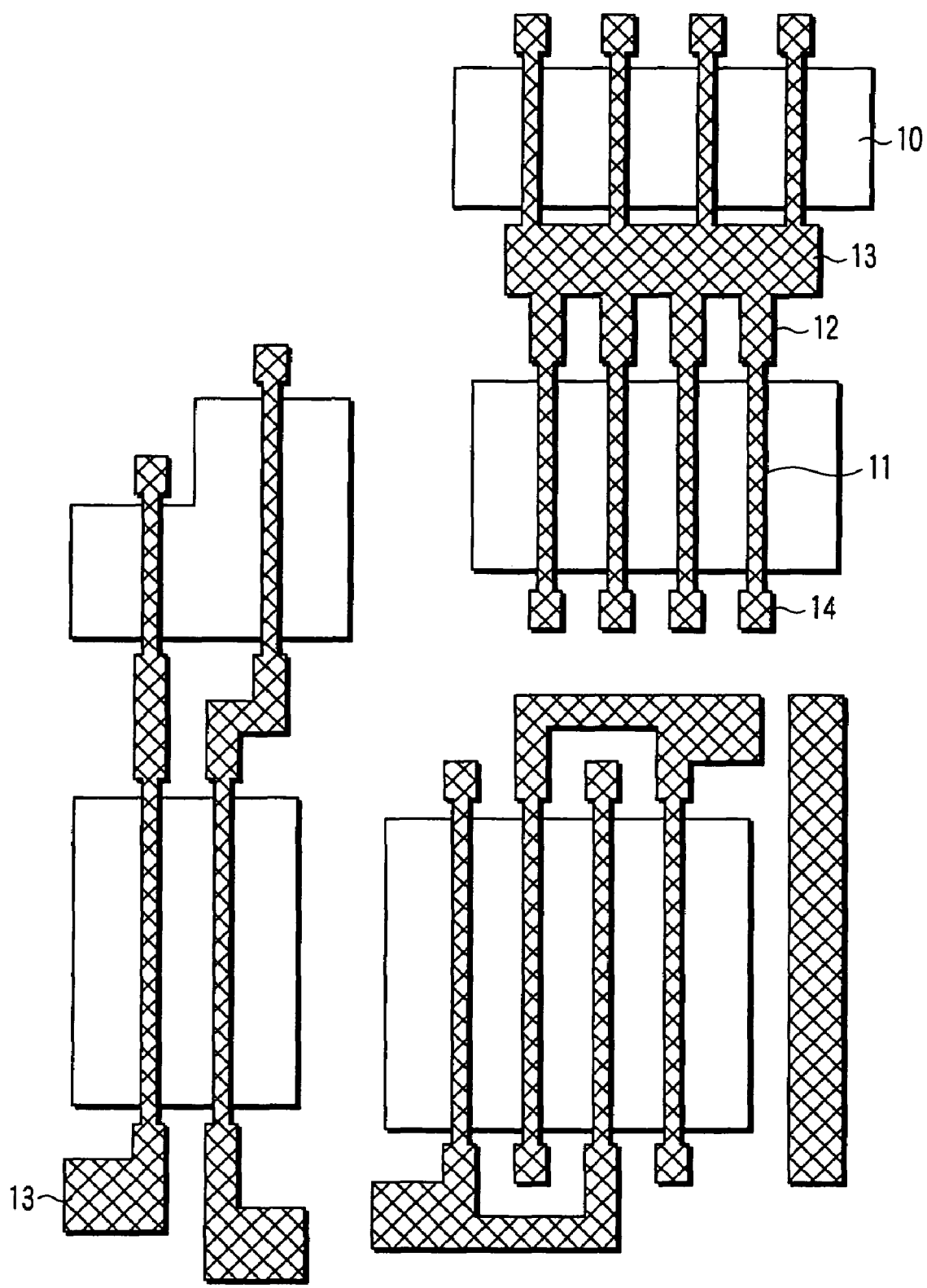
FIG. 1 is a main plan view for explaining an example of a gate wiring pattern of a random logic used in a first embodiment of the invention.

FIG. 1 is a diagram showing a gate wiring pattern of a random logic used in a first embodiment of the present invention.

In the logic pattern shown in FIG. 1, reference numeral 10 denotes an active region (active region); 11, a gate portion; 12, an interconnect; 13, a contact pad portion; and 14, an extended portion. The gate portion 11 has a line width (gate length) of 30 nm, the interconnect 12 has a line width of 140 nm, the contact pad portion 13 has a width of 320 nm, and the extended portion 14 has a length of 120 nm and a width of 160 nm in a direction parallel to the gate.

Basic processes performed when the pattern is formed by a double exposure method and a double transfer method will be described below with reference to FIGS. 2 to 10.

Figure 2:
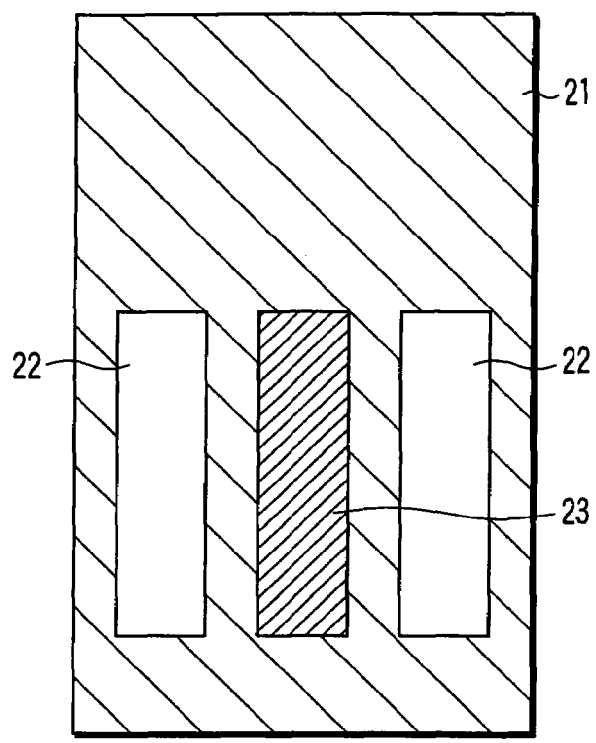
FIG. 2 is a plan view of an alternating phase shifting mask for explaining a pattern forming method using a double exposure method.
Figure 5:
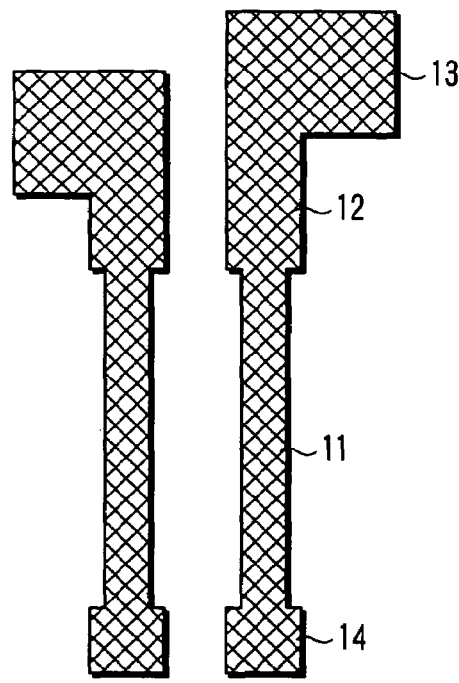
FIG. 5 is a diagram showing a gate pattern.

With respect to the double exposure method, when a gate pattern shown in FIG. 5 is formed, as a first photomask, an alternating phase shifting mask in which openings are formed to interpose the gate portions 11 arranged on the active region 10 as shown in FIG. 2 and phase shifters are alternately arranged to interpose the gate portions 11 is used.

The alternating phase shifting mask is a mask in which a phase shifter is formed at one opening to give a phase difference of 180° to exposure light passing through opening regions which are adjacent to each other to impose a light-shielding region. A halftone phase shift mask is obtained as follows. That is, a light-shielding portion in a binary mask is replaced with a semi-transparent film, and the phase difference and the transmittance of the semi-transparent film are controlled to change a phase difference between the semi-transparent film and exposure light passing through an opening by 180°.

Figure 3:
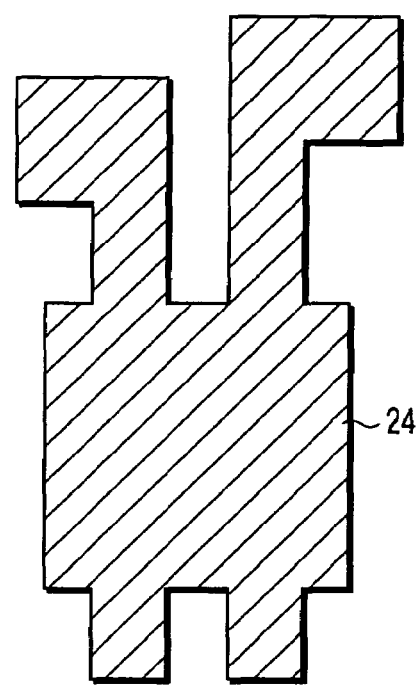
FIG. 3 is a diagram showing a light-shielding pattern of a binary mask.

In the alternating phase shifting mask shown in FIG. 2, reference numeral 21 denotes a chromium light-shielding film (light-shielding portion), and reference numeral 22 denotes a 0° opening, and reference numeral 23 denotes a 180° opening. Furthermore, as a second photomask, as shown in FIG. 3, a binary mask in which a light-shielding pattern including a light-shielding portion 24 which covers the interconnect 12, the contact pad portion 13, and the gate portion 11 is used. These masks are sequentially used to expose an active region of a semiconductor substrate from an exposure light source (not shown).

Figure 4:
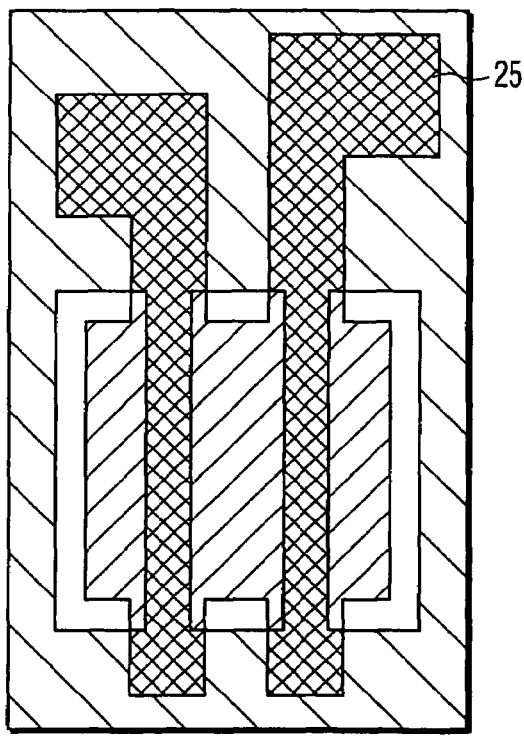
FIG. 4 is a diagram showing a pattern obtained by overlapping the alternating phase shifting mask in FIG. 2 and the binary mask in FIG. 3.

In this case, as shown in FIG. 4, a dark portion 25 on which exposure light is not irradiated is formed in a region where the light-shielding portions 21 and 24 overlap. Therefore, a positive type resist is used, a resist pattern is formed on the dark portion 25 by an etching process. In this case, the mask (the binary mask shown in FIG. 3) used in the second exposure is called a trim mask. This method is called a multiple exposure method (double exposure method in this embodiment).

Figure 6:
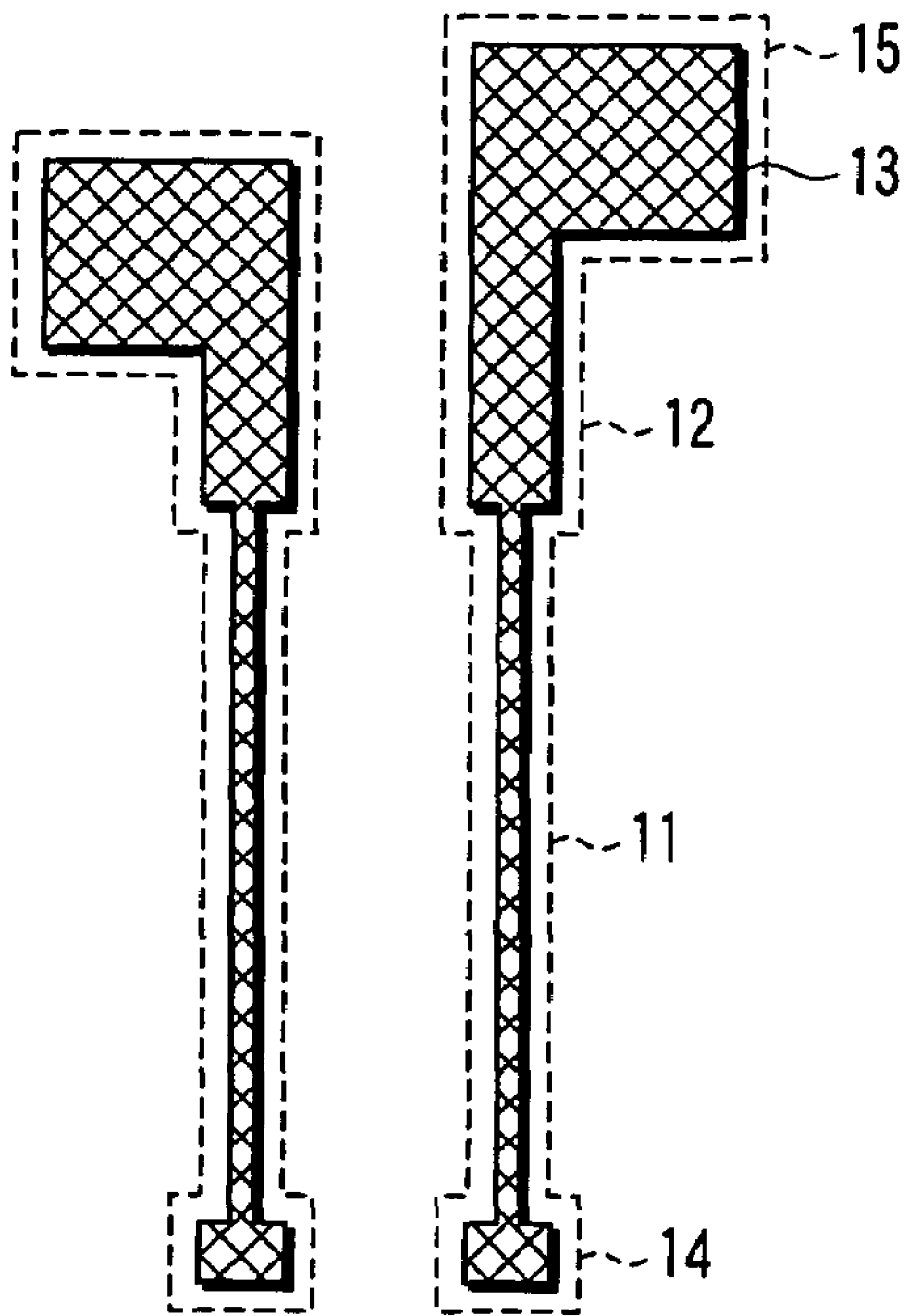
FIG. 6 is a diagram showing a gate pattern.

Thereafter, as shown in FIG. 6, a resist underlying film is patterned by etching (for example, RIE (Reactive Ion Etching)) using the formed resist pattern as a mask to form a gate. At this time, the underlying film is subjected to a slimming process. As a gate material, a polysilicon film or a silicon germanium film is often used. The slimming process is a process called a trimming process or a resist trimming process.

Figure 7:
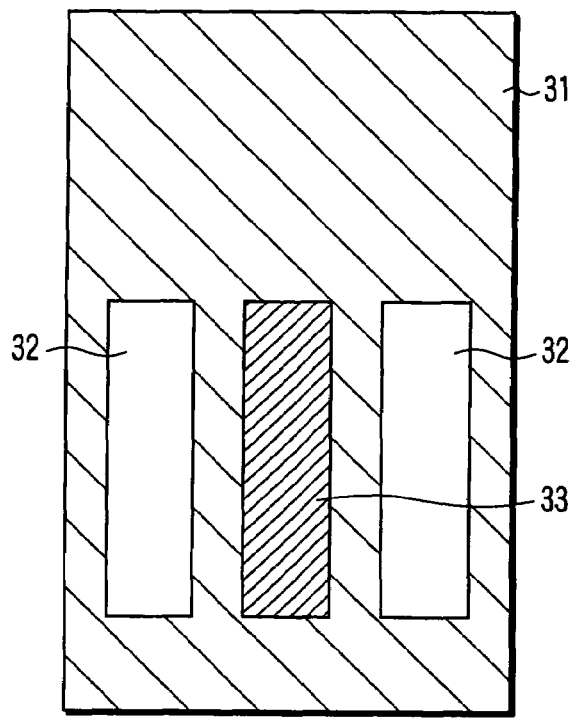
FIG. 7 is a plan view of an alternating phase shifting mask for explaining a pattern forming method using a double transfer method.
Figure 8:
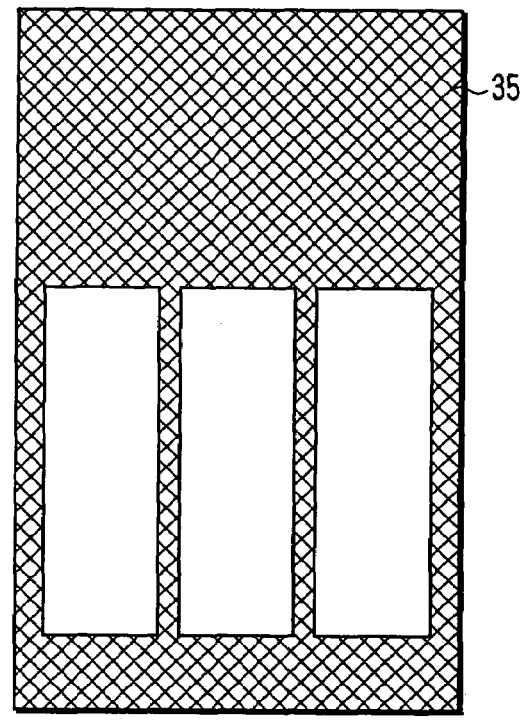
FIG. 8 is a diagram showing a pattern of an underlying film obtained after a first process.
Figure 9:
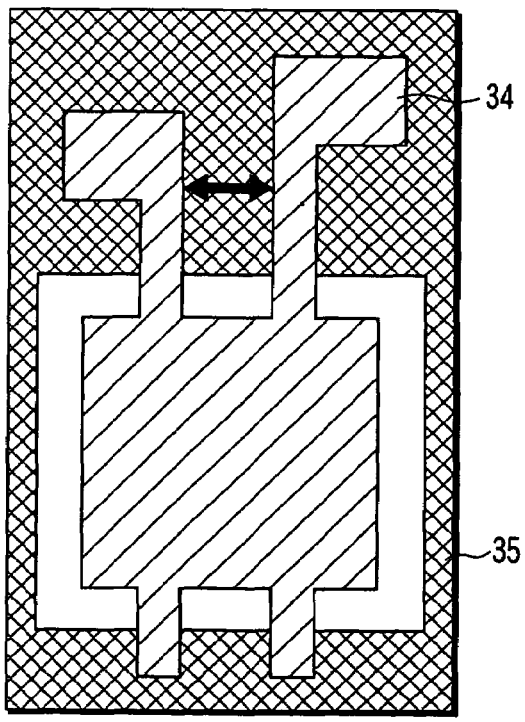
FIG. 9 is a plan view obtained when a resist pattern is formed on the pattern in FIG. 8.
Figure 10:
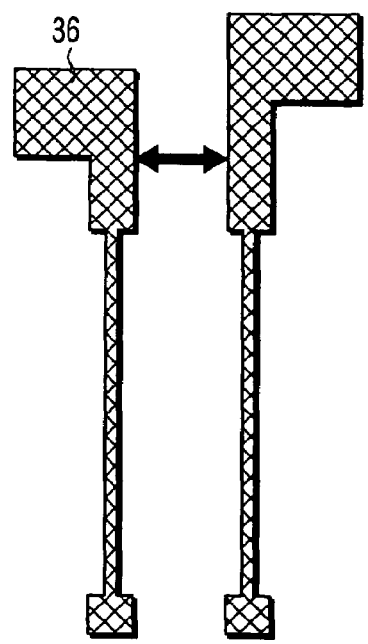
FIG. 10 is a diagram showing a pattern of an underlying film obtained after a second process.

The double transfer method will be described below in detail. The active region of the semiconductor substrate coated with a resist is exposed by using the alternating phase shifting mask shown in FIG. 7, and additionally etched to form a first resist pattern (not shown). In FIG. 7, reference numeral 31 denotes a light-shielding film, reference numeral 32 denotes a 0° opening, and reference numeral 33 denotes a 180° opening. As shown in FIG. 8, an underlying film is patterned by using the first resist pattern. At this time, the underlying material film is subjected to the slimming process. This patterning forms a first underlying pattern 35 as shown in FIG. 8. Then, after the first resist pattern is peeled, a resist is coated on the active region of the semiconductor substrate again. The active region of the semiconductor substrate is exposed by using the trim mask as shown in FIG. 3 and additionally etched to form a second resist pattern 34 as shown in FIG. 9. Thereafter, the underlying film (first underlying pattern 35) is patterned by using the second resist pattern 34. At this time, the underlying film is not slimmed, or is slightly slimmed. This patterning forms a second underlying film pattern 36 (gate pattern) as shown in FIG. 10.

Reference numeral 35 denotes an underlying film pattern obtained such that the first photomask is exposed and subjected to a first processing. Reference numeral 36 denotes an underlying film pattern obtained such that the second photomask is exposed and subjected to a second processing.

The slimming is a method which forms a smaller gate relative to a resist pattern to form a finer gate. After the resist pattern is formed, in the step of processing the underlying film, and finally, up to the gate material film by using the resist pattern, to form a gate, a smaller pattern is obtained by using a method such as an isotropic etching method. This process is a slimming process. This slimming process is effective to form a fine gate smaller than a resolution limit of lithography.

An example obtained by applying the double transfer method to a gate forming process of a MOS transistor will be described below.

Figure 11:
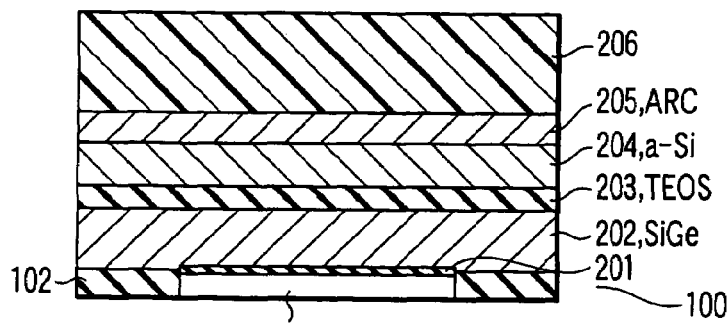
FIG. 11 is a sectional view of a structure in one step of manufacturing a MOS transistor by a slimming method.

As shown in FIG. 11, a gate insulating film 201 is formed on an Si substrate 100 having an active region 101 and a device isolation region 102 by a thermal oxidation method. An SiGe film 202 is deposited as a gate electrode material film by a CVD (Chemical Vapor Deposition) method or the like. Subsequently, on the gate electrode material film 202, a TEOS film 203 is formed by the CVD method, and an a-Si (amorphous silicon) film 204 is deposited by a sputtering method. On the a-Si film 204, an anti-reflection film (ARC film) 205 and a resist 206 are coated and baked.

Figure 12:
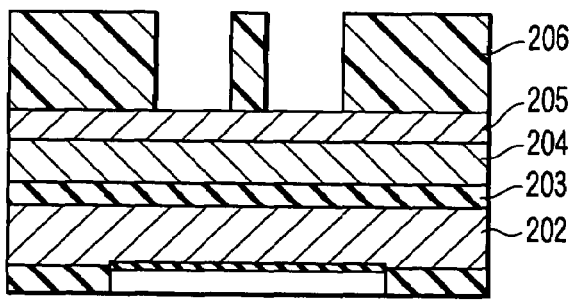
FIG. 12 is a sectional view of a structure in a manufacturing step, subsequent to the step in FIG. 11, of the MOS transistor obtained by the slimming method.
Figure 13:
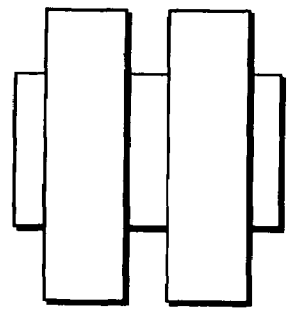
FIG. 13 is a plan view of the MOS transistor structure in the step in FIG. 11.

As shown in FIGS. 12 and 13, by using the alternating phase shifting mask as a first mask, exposure and development are performed to form a resist pattern 206. In this case, the first mask pattern is formed on the basis of pattern data subjected to an OPC process in advance, which will be described later.

Figure 14:
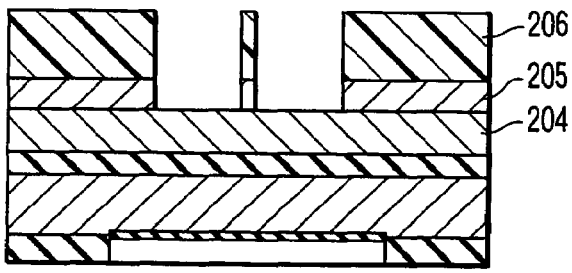
FIG. 14 is a sectional view of a structure in a manufacturing step, subsequent to the step in FIG. 12, of the MOS transistor obtained by the slimming method.
Figure 15:
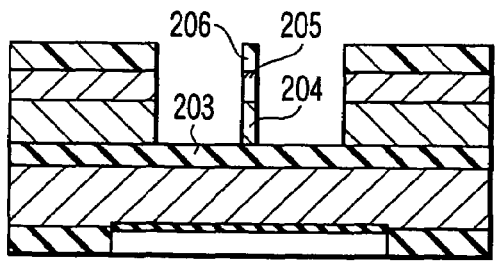
FIG. 15 is a sectional view of a structure in a manufacturing step, subsequent to the step in FIG. 14, of the MOS transistor obtained by the slimming method.
Figure 16:
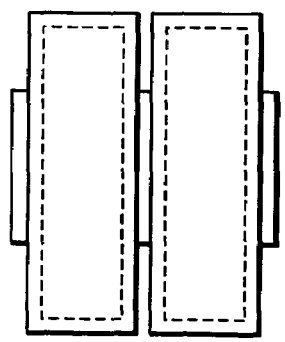
FIG. 16 is a plan view of a MOS transistor structure in the step in FIG. 15.

As shown in FIG. 14, the ARC film 205 is etched by the RIE using the resist pattern 206. As shown in FIGS. 15 and 16, the a-Si film 204 is etched by using the RIE (first processing). In a general RIE, a film to be processed is etched such that a conversion difference between the resist pattern size and the pattern size of the film to be processed is eliminated. However, in the RIE for etching the a-Si film 204 and the ARC film 205, RIE conditions are controlled such that the pattern size of the film to be processed is smaller than the size of the resist pattern. That is, slimming is performed. In this manner, the pattern of the gate portion is formed on the a-Si film 204.

Figure 17:
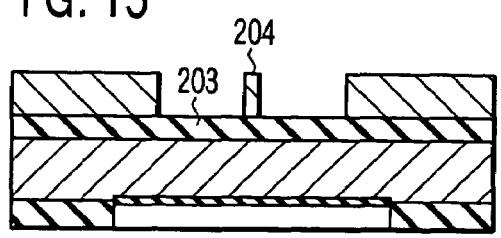
FIG. 17 is a sectional view of a structure in a manufacturing step, subsequent to the step in FIG. 15, of the MOS transistor obtained by the slimming method.
Figure 18:
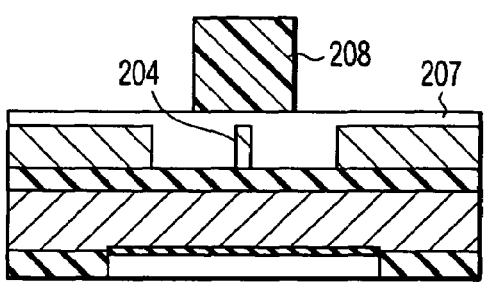
FIG. 18 is a sectional view of a structure in a manufacturing step, subsequent to the step in FIG. 17, of the MOS transistor obtained by the slimming method.
Figure 19:
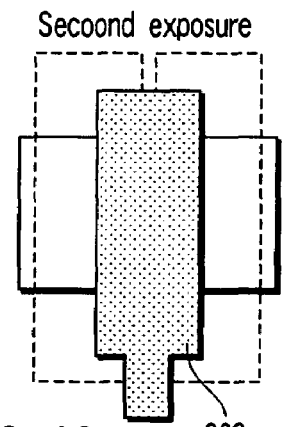
FIG. 19 is a plan view of a MOS transistor structure in the step in FIG. 18.

As shown in FIG. 17, the ARC film 205 and the resist pattern 206 are peeled. As shown in FIGS. 18 and 19, an ARC film 207 and a resist 208 are coated and baked on the a-Si film 204. Exposure and development are performed by using a trim mask as a second mask to form a resist pattern 208.

Figure 20:
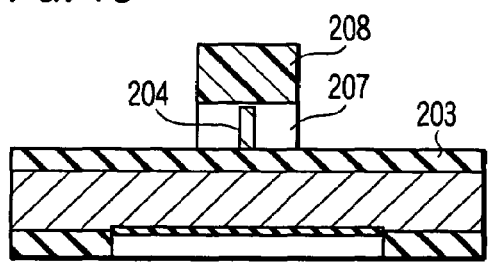
FIG. 20 is a sectional view of a structure in a manufacturing step, subsequent to the step in FIG. 18, of the MOS transistor obtained by the slimming method.

As shown in FIG. 20, the ARC film 207 and the a-Si film 204 are subjected to RIE (second processing) by using the resist pattern 208. When the second processing is performed, the TEOS film 203 is partially exposed. The second processing is performed under such conditions that the processed a-Si film 204 is further processed and the exposed TEOS film 203 is not processed. In this step, although a wiring portion is formed, the conditions are controlled such that inter-wiring spaces are prevented from being increased in size as much as possible with respect to the resist pattern, i.e., slimming is prevented from being performed.

Figure 21:
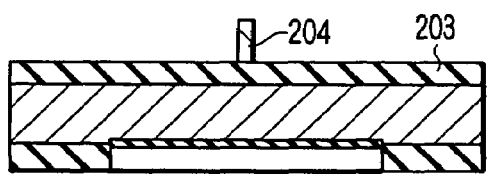
FIG. 21 is a sectional view of a structure in a manufacturing step, subsequent to the step in FIG. 20, of the MOS transistor obtained by the slimming method.
Figure 23:
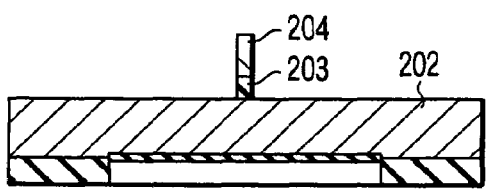
FIG. 23 is a sectional view of a structure in a manufacturing step, subsequent to the step in FIG. 21, of the MOS transistor obtained by the slimming method.
Figure 24:
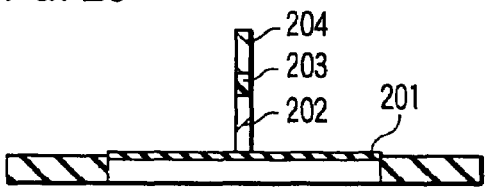
FIG. 24 is a sectional view of a structure in a manufacturing step, subsequent to the step in FIG. 23, of the MOS transistor obtained by the slimming method.
Figure 25:
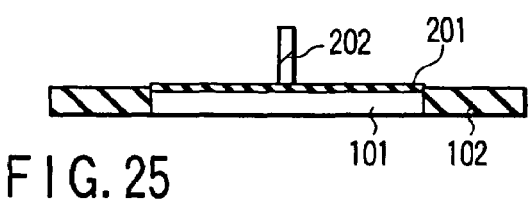
FIG. 25 is a sectional view of a structure in a manufacturing step, subsequent to the step in FIG. 24, of the MOS transistor obtained by the slimming method.
Figure 22:
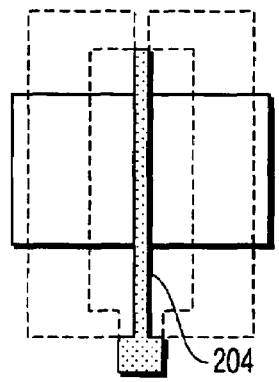
FIG. 22 is a plan view of a MOS transistor structure in the step in FIG. 21.
Figure 26:
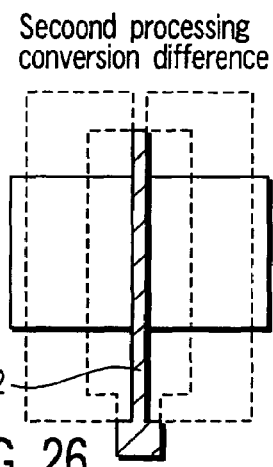
FIG. 26 is a plan view of a MOS transistor structure in the step in FIG. 25.

As shown in FIGS. 21 and 22, the ARC film 207 and the resist pattern 208 are peeled. The TEOS film 203 is etched by using RIE using the pattern of the a-Si film 204 as a mask as shown in FIG. 23. As shown in FIG. 24, the SiGe film 202 is etched by using RIE. As shown in FIGS. 25 and 26, the a-Si film 204 and the TEOS film 203 are peeled.

TEOS is used as the material of the TEOS film 203 because the TEOS is rarely etched in the RIE of the a-Si film 204, i.e., a high selectivity can be set between the TEOS film 203 and the a-Si film 204. For this reason, the TEOS is a material which functions as an etching stop film in the RIE of the a-Si film 204, which has a high selectivity relative to SiGe of the SiGe film 202 in the RIE of the SiGe film 202, and which is suitable for processing.

After the step, although not shown, impurities are implanted into the Si substrate surface exposed by using the gate pattern as a mask to form a source/drain diffusion layer of a transistor. Known interlayer insulating film formation, a metal wiring step, and the like are performed to complete a MOS transistor.

Figure 27:
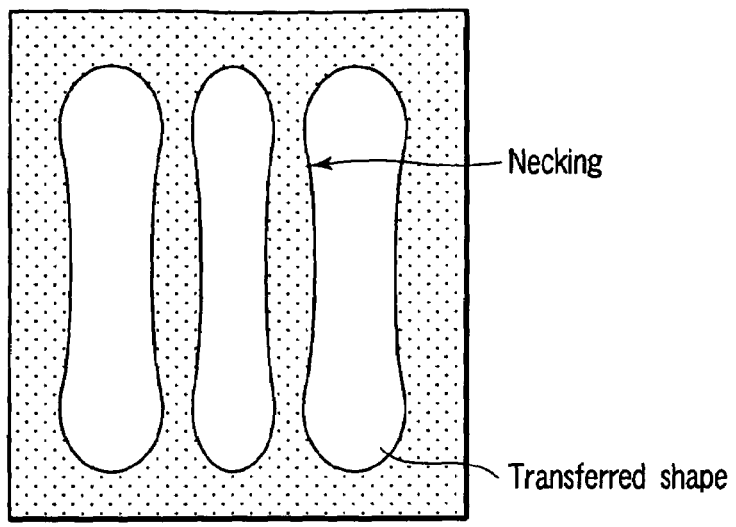
FIG. 27 is a pattern diagram for explaining a problem of necking in formation of a Levenson pattern.

In these processes, in the resist pattern obtained by exposure and development using the first alternating phase shifting mask and the underlying film pattern obtained by processing using the resist pattern as a mask, as shown in FIG. 27, a constriction called necking is generated. The necking is generated at a dark portion located between the 0° opening and the 180° opening of the alternating phase shifting mask and spaced apart from the corner of the 0° opening or the 180° opening by a distance (0.6λ to 1.3λ (λ: exposure light wavelength)) slightly shorter than an exposure light wavelength. When exposure is performed under illumination conditions: exposure light wavelength=193 nm (ArF exposure), NA=0.7, and σ=0.3, the necking is generated at a position spaced about 160 nm apart from the corners of the 0° opening and the 180° opening of the mask in the resist pattern and the underlying layer pattern.

Figure 30:
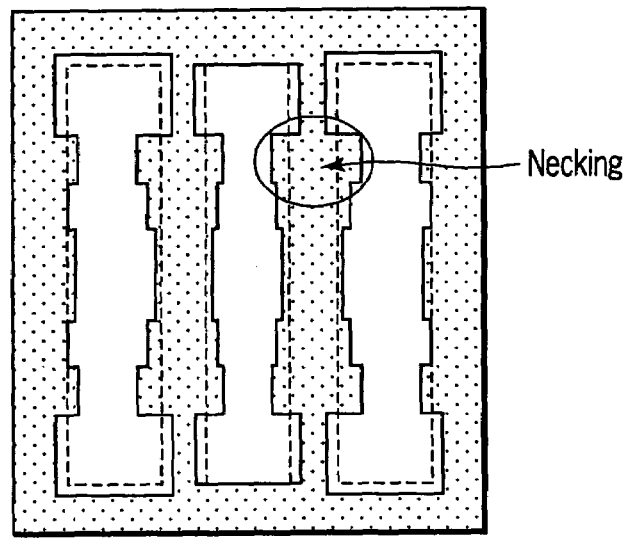
FIG. 30 is a plan view showing a mask shape corrected by OPC.
Figure 31:
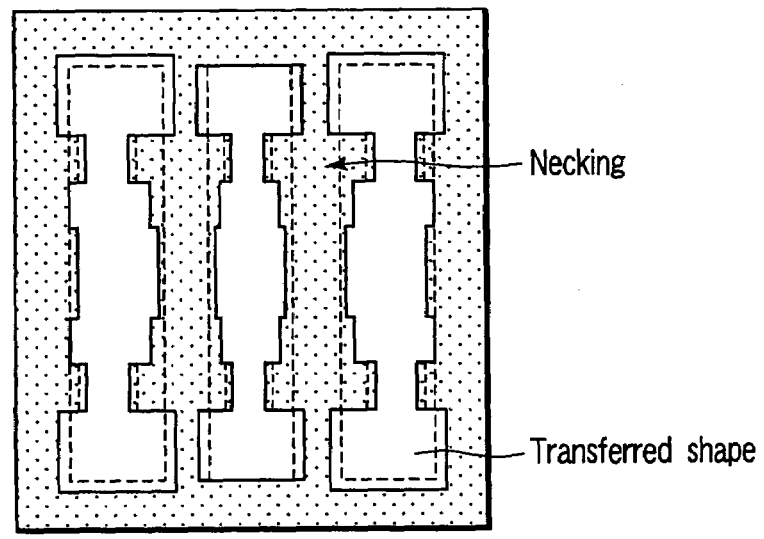
FIG. 31 is a plan view showing a mask shape corrected by OPC.

In order to correct the necking, one local point of the mask pattern must be corrected. However, in the conventional technique, one local point of the mask pattern cannot be easily corrected at a high accuracy. Therefore, in this embodiment, correction is performed by ordinary model-based OPC (mask shape used in this case is shown in FIG. 30). Thereafter, only a necking portion is additionally corrected by rule-based OPC (mask shape used in this case is shown in FIG. 31). In this manner, in this embodiment, correction accuracy of necking can be improved.

Figure 28:
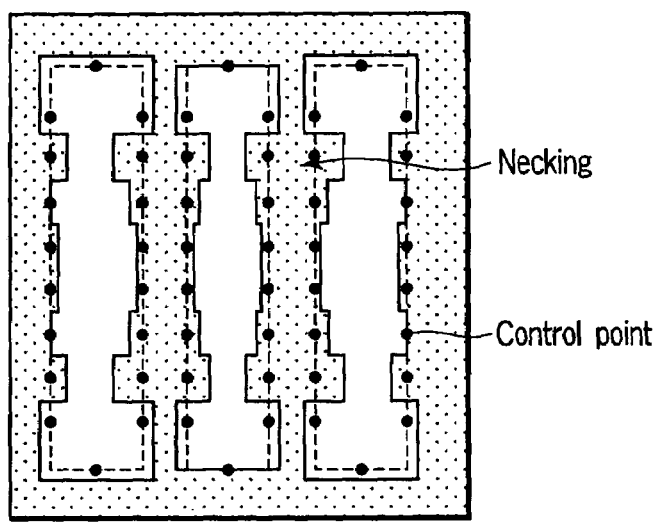
FIG. 28 is a pattern diagram for explaining a pattern correction method.
Figure 29:
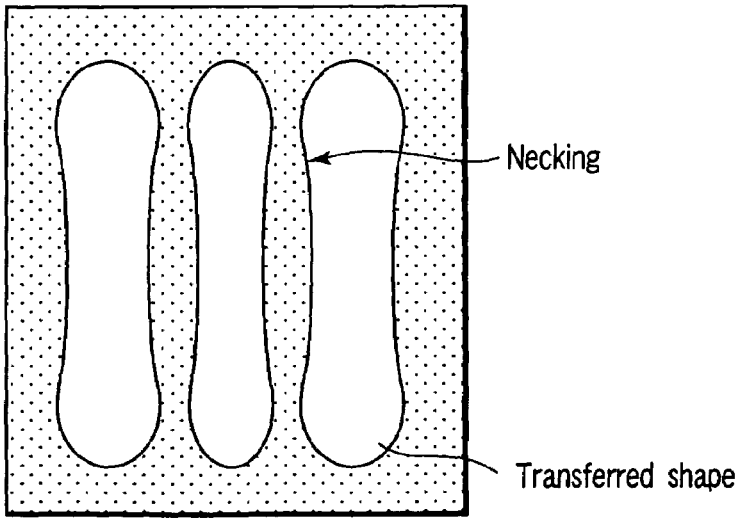
FIG. 29 is a pattern diagram for explaining a pattern correction method.

In FIG. 28, a first control point is set at a position spaced 80 nm apart from the corner of the pattern opening, and, second, third, and subsequent control points are sequentially set at intervals of 80 nm depending on the distance from the corner of the pattern opening. As segments, a region extending from the corner of the pattern opening by 120 nm is set as a first segment. Subsequently, regions of every 80 nm are set as second, third, and subsequent segments depending on the distance from the corner of the pattern opening. More specifically, the first control point is located at a position spaced 80 nm apart from the corner of the first segment, and the second, third, and subsequent control points are located at the centers of the second, third, and subsequent segments, respectively.

Additional correction by the rule-based OPC is performed to the second segment corresponding to the necking portion. More specifically, with respect to other segments except for a segment including the necking portion, i.e., segments spaced apart from the corner of the pattern opening, the additional correction is not performed. For this reason, processing time and an amount of processing data can be suppressed from increasing without deterioration of correction accuracy caused by OPC.

Figure 32:
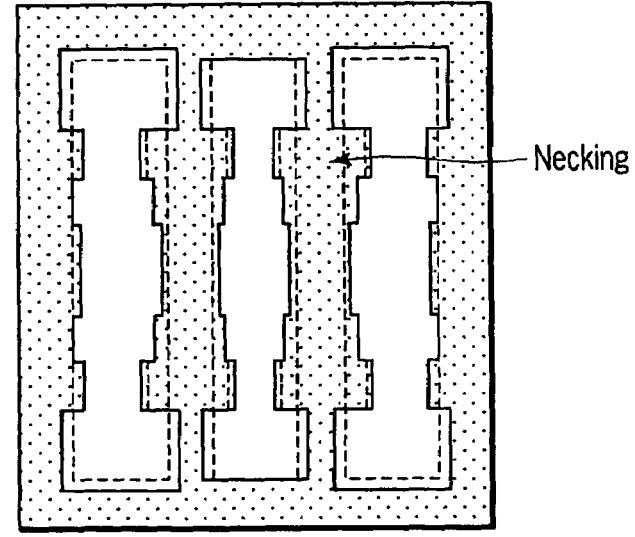
FIG. 32 is a plan view showing a mask shape corrected by OPC.

In the additional correction, as shown in FIG. 32, a necking portion of an edge constituting a gate may be finally extracted, and only the extracted necking portion may be additionally corrected. An edge (left edge of a left blank portion and a right edge of a right blank portion in FIG. 32) does not require very high correction accuracy. The additional correction is performed to only a portion which requires high correction accuracy to suppress processing time from increasing.

Finally, data subjected to the correction process using OPC is converted into writing data to manufacture a mask, and the mask is manufactured.

A semiconductor device is manufactured by using the manufactured mask to make it possible to suppress a leak current of the gate and to make it possible to improve the characteristics of the semiconductor device.

More specifically, according to the embodiment, in a method of manufacturing a semiconductor device including a random logic region, in a process of finally etching a gate wiring material film (for example, a polysilicon film) by using RIE through exposure and development by using the alternating phase shifting mask and exposure and development by using the trim mask to form a gate wiring pattern (polysilicon pattern) in the random logic region, a necking generated at a portion spaced apart from corners of openings of the resist pattern obtained by the exposure and the development by using the alternating phase shifting mask and the underlying film pattern obtained by the processing using the resist pattern as a mask by a distance of about exposure light wavelength× 0.8 can be effectively corrected.

In the embodiment, the exposure and development by using the alternating phase shifting mask are performed first, and the exposure and development by using the trim mask are performed. However, this order may be reverse. More specifically, the exposure and development by using the trim mask may be performed first, and the exposure and development by using the alternating phase shifting mask may be performed. Furthermore, gate electrodes are classified into a gate electrode of a pMOS transistor and a gate electrode of an nMOS transistor. When the processing characteristics of a gate electrode material of the PMOS transistor and the processing characteristics of a gate electrode material of the nMOS transistor are different from each other, different correction values are desirably applied to corrections for the gate electrode patterns of the pMOS and nMOS transistors. More specifically, in such a case, in the embodiment, correction values of the processing conversion difference in the second processing step are set as the values for the pMOS and nMOS transistors, respectively.

Second Embodiment

In this embodiment, only a segment of a necking portion is corrected by rule-based OPC. A mask shape obtained after the correction is shown in FIG. 33. Additional correction is performed by model-based OPC. A mask shape obtained after the additional correction is shown in FIG. 34.

As in FIG. 28, a first control point is set at a position spaced 80 nm apart from a corner of a pattern opening, and second, third, and subsequent control points are sequentially arranged at intervals of 80 nm depending on the distance from the corner of the pattern opening. In this case, as segments, a first segment spaced 120 nm apart from the corner of the pattern opening is arranged, and second, third, and subsequent segments spaced 80 nm apart from the corner are sequentially arranged. More specifically, the first control point is located at a position spaced 80 nm apart from the corner of the segment, and the second, third, and subsequent control points are located at the centers of the second, third, and subsequent segments, respectively.

In this manner, the rule-based OPC is performed to the second segment corresponding to the necking portion. Finally, data subjected to the correction process using OPC is converted into writing data to manufacture a mask, and the mask is manufactured.

In this manner, in the embodiment, correction accuracy of necking can be improved. Furthermore, a mask is manufactured on the basis of the data formed through the data processing method. A semiconductor device is manufactured by using the mask, so that a leak current of a gate can be suppressed to make it possible to obtain preferable characteristics.

Since the rule-based OPC is not performed to an edge spaced apart from the corner of the pattern opening except for the necking, processing time and an amount of processed data can be suppressed from increasing without deteriorating OPC correction accuracy.

The rule-based OPC may be performed such that a necking portion of an edge on which a gate is finally formed is extracted. Additional correction is performed to only a portion which requires high accuracy to make it possible to suppress processing time from increasing.

Third Embodiment

In this embodiment, correction is performed by ordinary model-based OPC. A mask shape obtained after the correction is as shown in FIG. 30.

As in FIG. 28, a first control point is set at a position spaced 80 nm apart from a corner of a pattern opening, and second, third, and subsequent control points are sequentially arranged at intervals of 80 nm depending on the distance from the corner of the pattern opening. In this case, as segments, a first segment spaced 120 nm apart from the corner of the pattern opening is arranged, and second, third, and subsequent segments spaced 80 nm apart from the corner are sequentially arranged. More specifically, the first control point is located at a position spaced 80 nm apart from the corner of the segment, and the second, third, and subsequent control points are located at the centers of the second, third, and subsequent segments, respectively.

Figure 35:
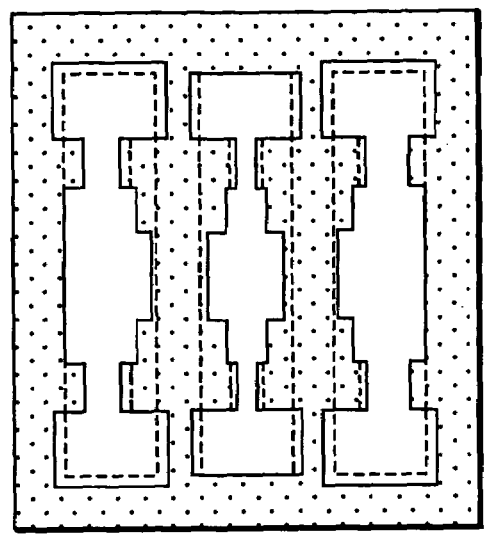
FIG. 35 is a plan view showing a mask shape the correction amount of which is changed.
Figure 36:
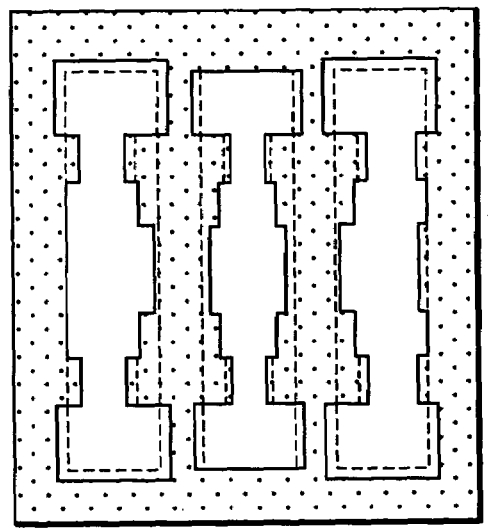
FIG. 36 is a plan view showing a mask shape the correction amount of which is changed.
Figure 37:
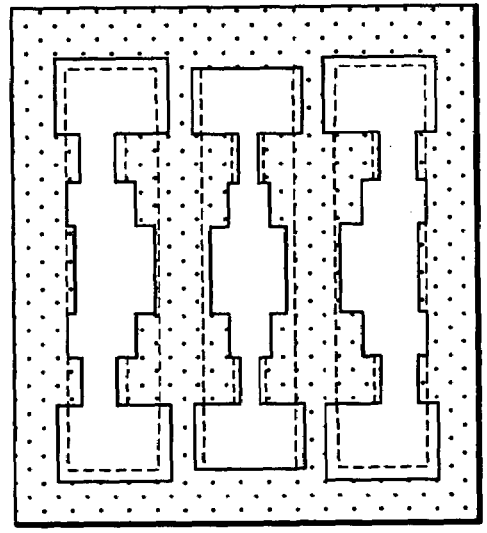
FIG. 37 is a plan view showing a mask shape the correction amount of which is changed.

Then only a necking portion is corrected. More specifically, amounts of correction of the second segments of mask pattern shape shown in FIGS. 35 to 37 are made different from each other every nanometer to form the mask pattern shape by data processing performed by a plurality of computers. Edge positions of transfer patterns to active regions of semiconductor devices of the mask pattern shape are calculated by simulation. A mask pattern shape the position of which is calculated as an edge position closest to the edge position of a target is selected as an optimum mask pattern.

Finally, data subjected to the correction process using OPC is converted into writing data to manufacture a mask, and the mask is manufactured.

A semiconductor device is manufactured by using the manufactured mask to make it possible to suppress a leak current of a gate and to improve the characteristics of the semiconductor device.

In this manner, according to the embodiment, correction is performed by the ordinary model-based OPC, and a plurality of correction amounts is given to a necking portion to select a correction amount at which a difference between an estimated shape obtained after transfer and a desired shape is minimum. For this reason, a portion at which the accuracy of a pattern shape is maximally deteriorated can be corrected at high accuracy, and improvement of pattern formation accuracy can be achieved.

Fourth Embodiment

In this embodiment, ordinary model-based OPC is performed first. A mask shape obtained after the correction is as shown in FIG. 30.

As in FIG. 28, a first control point is set at a position spaced 80 nm apart from a corner of a pattern opening, and second, third, and subsequent control points are sequentially arranged at intervals of 80 nm depending on the distance from the corner of the pattern opening. In this case, as segments, a first segment spaced 120 nm apart from the corner of the pattern opening is arranged, and second, third, and subsequent segments spaced 80 nm apart from the corner are sequentially arranged. More specifically, the first control point is located at a position spaced 80 nm apart from the corner of the first segment, and the second, third, and subsequent control points are located at the centers of the second, third, and subsequent segments, respectively.

A correction algorithm is changed to perform the model-based OPC again. More specifically, as shown in FIG. 31, only a necking portion, i.e., a second segment of a mask shape is corrected, and only a transfer edge position on an active region of a semiconductor substrate at the control point located at the center of the second segment is evaluated. A correction amount is determined such that the transfer edge position is closest to the edge position of a target.

Finally, data subjected to the correction process using OPC is converted into writing data to manufacture a mask, and the mask is manufactured.

A semiconductor device is manufactured by using the manufactured mask to make it possible to suppress a leak current of a gate and to improve the characteristics of the semiconductor device.

In this manner, according to the embodiment, correction by the ordinary model-based OPC is performed as the first step, and correction by the model-based OPC is performed again while changing the correction algorithm. For this reason, a portion at which the accuracy of a pattern shape is maximally deteriorated can be corrected at high accuracy to contribute to improvement of pattern formation accuracy.

As described above, an aspect of the present invention is a method of correcting mask data which performs a proximity effect correction process to a pattern shape of a photomask to obtain a desired shape and a desired size of a pattern of a photosensitive material film on a substrate to be processed or a film to be processed by using the photosensitive material film, and includes the following configurations (1) to (4).

(1) The configuration includes a step of performing model-based proximity effect correction to the pattern shape of the photomask, a step of calculating an estimated shape of the pattern in the photosensitive material film or the film to be processed by using the photosensitive material film on the basis of the pattern shape of the photomask obtained after the model-based proximity effect correction, a step of calculating an error between the calculated estimated shape and the desired shape, and a step of performing rule-based proximity effect correction to a predetermined interested portion on the basis of the calculated error to further correct the pattern shape of the photomask.

(2) The configuration includes a step of performing rule-based proximity effect correction to a predetermined interested portion to correct the pattern shape of the photomask, and a step of performing model-based proximity effect correction to further correct the pattern shape of the photomask.

(3) The configuration includes a step of performing model-based proximity effect correction to the pattern shape of the photomask, a step of calculating an estimated shape of a pattern on the photosensitive material film or the film to be processed by using the photosensitive material film on the basis of the pattern shape of the photomask obtained after the model-based proximity effect correction, a step of calculating an error between the calculated estimated shape and the desired shape, a step of giving a plurality of correction amounts to a predetermined interested portion to estimate a shape of the pattern on the photosensitive material film or the film to be processed by using the photosensitive material film, and a step of selecting an optimum pattern shape of the photomask such that the error between the calculated estimated shape and the desired shape is minimum.

(4) The configuration includes a first step of correcting the pattern shape of the photomask depending on a model which estimates an exposed or processed shape on the substrate to be processed, and a second step of changing a correction algorithm in the first step to further perform correction.

Another aspect of the present invention employs the following configurations.

(5) In the items (1) to (4), the alternating phase shifting masks are used as the photomasks.

(6) A method of manufacturing a semiconductor device having a process which exposes a desired pattern on a substrate to be processed by using an alternating phase shifting mask in which 0° openings and 180° openings are alternately formed to interpose transistor gate portions, uses a method of correcting mask data described in any one of the items (1) to (4) to perform a proximity effect correction process to a pattern shape of the alternating phase shifting mask.

(7) In the item (6), an interested portion is a necking of a dark portion generated between a 0° opening and a 180° opening at a position spaced 0.6λ to 1.3λ (λ: exposure light wavelength) apart from a corner of the 0° opening or the 180° opening of the alternating phase shifting mask.

(8) In a method of manufacturing a semiconductor device using an alternating phase shifting mask in which 0° openings and 180° openings are alternately formed to interpose transistor gate portions, in a proximity effect correction process which performs, as a process to obtain pattern data of the alternating phase shifting mask, correction to a pattern shape of the alternating phase shifting mask to obtain a desired shape and a desired size of a pattern of a photosensitive material film on a substrate to be processed or a film to be processed by using the photosensitive material film, model-based proximity effect correction is performed, an estimated shape of the photosensitive material film pattern or a film pattern to be processed by using the photosensitive material film pattern is calculated on the basis of the corrected pattern shape of the photomask, and rule-based proximity effect correction is performed to a necking portion of a dark portion generated between the 0° opening and the 180° opening at a position spaced 0.6λ to 1.3λ (λ: exposure light wavelength) apart from a corner of the opening to further correct the pattern shape of the alternating phase shifting mask.

(9) In a method of manufacturing a semiconductor device using an alternating phase shifting mask in which 0° openings and 180° openings are alternately formed to interpose transistor gate portions, in a proximity effect correction process which performs, as a process to obtain pattern data of the alternating phase shifting mask, correction to a pattern shape of the alternating phase shifting mask to obtain a desired shape and a desired size of a pattern of a photosensitive material film on a substrate to be processed or a film to be processed by using the photosensitive material film, rule-based proximity effect correction is performed to a necking portion of a dark portion generated between the 0° opening and the 180° opening at a position spaced 0.6λ to 1.3λ (λ: exposure light wavelength) apart from a corner of the opening, model-based proximity effect correction is performed, an estimated shape of a photosensitive material film pattern or a film pattern to be processed by using the photosensitive material film pattern is calculated on the basis of the corrected pattern shape of the photomask to calculate an error between the estimated shape and the desired shape, and the pattern shape of the alternating phase shifting mask is further corrected.

(10) In the items (8) and (9), edges to which the rule-based proximity effect correction is to be performed are edges of the 0° opening and the 180° opening adjacent to the transistor gate portions.

According to the embodiments of the present invention, a mask pattern corresponding to a portion which requires the highest accuracy on a pattern shape can be corrected at high accuracy, and a desired pattern shape and a desired pattern size can be obtained. More specifically, a portion the shape and size of which are desired to be obtained at the highest accuracy on the pattern shape is extracted, and, when correction accuracy is short in model-based proximity effect correction, rule-based proximity effect correction is performed as additional correction according to a prepared correction value to perform correction at high accuracy. For this reason, the desired pattern shape and the desired pattern size can be obtained. In this case, data processing time and an amount of data can be suppressed from unnecessarily increasing. Therefore, the invention contributes to improvement of pattern formation accuracy.

A pattern of an alternating phase shifting mask corresponding to a necking portion of a gate pattern shape can be corrected at high accuracy such that gates are prevented from being thinly formed, and a desired pattern shape and a desired pattern size can be obtained. In this case, data processing time and an amount of data can also be suppressed from unnecessarily increasing.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method of correcting mask data which performs a proximity effect correction process to a pattern shape of a photomask to form a photosensitive material film provided on a substrate to be processed or a film to be processed by using the photosensitive material film as a mask to pattern the film to be processed into a desired shape, the method comprising:

performing a model-based proximity effect correction to a gate forming pattern of the photomask to correct the pattern shape of the photomask; and performing a rule-based proximity effect correction to a portion of the gate forming pattern subjected to the model-based proximity effect correction to further correct the pattern shape of the photomask, the portion of the gate forming pattern corresponding to a portion of a pattern, at which portion a necking is generated, obtained when the gate forming pattern subjected to the model-based proximity effect correction is transferred to the photosensitive material film or the film to be processed.

2. The method of correcting mask data according to claim 1, wherein
an alternating phase shifting mask is used as the photomask, and a 0° opening which gives a phase difference of 0° to passing exposure light and a 180° opening which gives a phase difference of 180° to the passing exposure light are formed in the alternating phase shifting mask to interpose a portion corresponding to a gate portion of a transistor.

3. The method of correcting mask data according to claim 2, wherein
the portion of the pattern, at which portion the necking is generated, is located between the 0° opening and the 180° opening at a position spaced apart from a corner of the 0° opening or the 180° opening of the alternating phase shifting mask by a distance substantially corresponding to an exposure light wavelength.

4. A method of manufacturing a mask, comprising:
converting mask pattern data corrected by the method of correcting mask data according to claim 1 into writing data and manufacturing a photomask having a mask pattern of the corrected shape by using the converted writing data.

5. A method of manufacturing a semiconductor device, comprising:
exposing and transferring a pattern of a desired shape to a film to be processed on a semiconductor wafer by using a photomask manufactured by the method of manufacturing a mask according to claim 4 and processing the film to be processed to form a film pattern to be processed of the transferred pattern shape on the semiconductor wafer.

6. A method of correcting mask data which performs a proximity effect correction process to a pattern shape of a photomask to form a photosensitive material film provided on a substrate to be processed or a film to be processed by using the photosensitive material film as a mask to pattern the film to be processed into a desired shape, the method comprising:

performing a rule-based proximity effect correction to a portion of a gate forming pattern of the photomask to correct the pattern shape of the photomask, the portion of the gate forming pattern corresponding to a portion of a pattern, at which portion a necking is generated, obtained when the gate forming pattern is transferred to the photosensitive material film or the film to be processed; and performing a model-based proximity effect correction to further correct the pattern shape of the photomask subjected to the rule-based proximity effect correction.

7. The method of correcting mask data according to claim 6, wherein an alternating phase shifting mask is used as the photomask, and a 0° opening which gives a phase difference of 0° to passing exposure light and a 180° opening which gives a phase difference of 180° to the passing exposure light are formed in the alternating phase shifting mask to interpose a portion corresponding to a gate portion of a transistor.

8. The method of correcting mask data according to claim 7, wherein the predetermined portion of the pattern, at which portion the necking is generated, is located between the 0° opening and the 180° opening at a position spaced apart from a corner of the 0° opening or the 180° opening of the alternating phase shifting mask by a distance substantially corresponding to an exposure light wavelength.

9. A method of manufacturing a mask, comprising:

converting mask pattern data corrected by the method of correcting mask data according to claim 6 into writing data and manufacturing a photomask having a mask pattern of the corrected shape by using the converted writing data.

10. A method of manufacturing a semiconductor device, comprising:

exposing and transferring a pattern of a desired shape to a film to be processed on a semiconductor wafer by using a photomask manufactured by the method of manufacturing a mask according to claim 6 and processing the film to be processed to form a film pattern to be processed of the transferred pattern shape on the semiconductor wafer.

11. A method of correcting mask data which performs a proximity effect correction process to a pattern shape of a photomask to form a photosensitive material film provided on a substrate to be processed or a film to be processed by using the photosensitive material film as a mask to pattern the film to be processed into a desired shape, the method comprising:

performing a model-based proximity effect correction to a gate forming pattern of the photomask to correct the pattern shape of the photomask; and preparing a plurality of different correction amounts to a portion of the gate forming pattern subjected to the model-based proximity effect correction and selecting, based on the correction amounts, an optimum pattern share of the photomask at which an error between an estimated shape of a pattern of the photosensitive material film or the film to be processed and the desired shape of the pattern is minimum, the portion of the gate forming pattern corresponding to a portion of a pattern, at which portion a necking is generated, obtained when the gate forming pattern is transferred to the photosensitive material film or the film to be processed.

12. The method of correcting mask data according to claim 11, wherein an alternating phase shifting mask is used as the photomask, and a 0° opening which gives a phase difference of 0° to passing exposure light and a 180° opening which gives a phase difference of 180° to the passing exposure light are formed in the alternating phase shifting mask to interpose a portion corresponding to a gate portion of a transistor.

13. The method of correcting mask data according to claim 12, wherein the portion of the pattern, at which portion the necking is generated, is located between the 0° opening and the 180° opening at a position spaced apart from a corner of the 0° opening or the 180° opening of the alternating phase shifting mask by a distance substantially corresponding to an exposure light wavelength.

14. A method of manufacturing a mask, comprising:

converting mask pattern data corrected by the method of correcting mask data according to claim 11 into writing data and manufacturing a photomask having a mask pattern of the corrected shape by using the converted writing data.

15. A method of manufacturing a semiconductor device, comprising:

exposing and transferring a pattern of a desired shape to a film to be processed on a semiconductor wafer by using a photomask manufactured by the method of manufacturing a mask according to claim 14 and processing the film to be processed to form a film pattern to be processed of the transferred pattern shape on the semiconductor wafer.

16. A method of correcting mask data which performs a proximity effect correction process to a pattern shape of a photomask to form a photosensitive material film provided on a substrate to be processed or a film to be processed by using the photosensitive material film as a mask to pattern the film to be processed into a desired shape, the method comprising:

performing a first model-based proximity effect correction to a gate forming pattern of the photomask to correct the pattern shape of the photomask; and performing a second model-based proximity effect correction to a portion of the photomask subjected to the first model-based proximity effect correction using a second correction algorithm changed from a first correction algorithm used in the first model-based proximity effect correction, to further correct the pattern shape of the photomask, the portion of the gate forming pattern corresponding to a portion of a pattern, at which portion a necking is generated, obtained when the gate forming pattern subjected to the first model-based proximity effect correction is transferred to the photosensitive material film or the film to be processed.

17. The method of correcting mask data according to claim 16, wherein an alternating phase shifting mask is used as the photomask.

18. The method of correcting mask data according to claim 17, wherein a 0° opening which gives a phase difference of 0° to passing exposure light and a 180° opening which gives a phase difference of 180° to the passing exposure light are formed in the alternating phase shifting mask to interpose a portion corresponding to a gate portion of a transistor.

19. A method of manufacturing a mask, comprising:
converting mask pattern data corrected by the method of correcting mask data according to claim 16 into writing data and manufacturing a photomask having a mask pattern of the corrected shape by using the converted writing data.

20. A method of manufacturing a semiconductor device, comprising:

exposing and transferring a pattern of a desired shape to a film to be processed on a semiconductor wafer by using a photomask manufactured by the method of manufacturing a mask according to claim 19 and processing the film to be processed to form a film pattern to be processed of the transferred pattern shape on the semiconductor wafer.

* * * * *